US009557397B2

(12) United States Patent
Rapoport

(10) Patent No.: US 9,557,397 B2
(45) Date of Patent: Jan. 31, 2017

(54) METHOD FOR MANIPULATING THE MRI'S PROTOCOL OF PULSE-SEQUENCES

(71) Applicant: Aspect Imaging Ltd., Shoham (IL)

(72) Inventor: Uri Rapoport, Moshav Ben Shemen (IL)

(73) Assignee: Aspect Imaging Ltd., Shoham (IL)

(*) Notice: Subject to any disclaimer, the term of this patent is extended or adjusted under 35 U.S.C. 154(b) by 617 days.

(21) Appl. No.: 14/070,695

(22) Filed: Nov. 4, 2013

(65) Prior Publication Data

US 2015/0123657 A1    May 7, 2015

(51) Int. Cl.
*G01R 33/54* (2006.01)
(52) U.S. Cl.
CPC ................... *G01R 33/543* (2013.01)
(58) Field of Classification Search
CPC ..................................... G01R 33/543
See application file for complete search history.

(56) References Cited

U.S. PATENT DOCUMENTS

| | | | |
|---|---|---|---|
| 6,407,548 B1 | 6/2002 | Dietz | |
| 7,061,240 B2 * | 6/2006 | Ham | G01R 33/3854 324/309 |
| 8,807,084 B2 | 8/2014 | Rapoport et al. | |
| 8,851,018 B2 | 10/2014 | Rapoport et al. | |
| 8,896,310 B2 | 11/2014 | Rapoport | |
| 2011/0162652 A1 | 7/2011 | Rapoport | |
| 2011/0186049 A1 | 8/2011 | Rapoport | |
| 2011/0234347 A1 | 9/2011 | Rapoport | |
| 2011/0304333 A1 | 12/2011 | Rapoport | |
| 2012/0071745 A1 | 3/2012 | Rapoport | |
| 2012/0073511 A1 | 3/2012 | Rapoport et al. | |
| 2012/0077707 A1 | 3/2012 | Rapoport | |
| 2012/0119742 A1 | 5/2012 | Rapoport | |
| 2013/0079624 A1 | 3/2013 | Rapoport | |
| 2013/0109956 A1 | 5/2013 | Rapoport | |
| 2013/0237803 A1 | 9/2013 | Rapoport | |
| 2013/0328559 A1 | 12/2013 | Rapoport | |

(Continued)

FOREIGN PATENT DOCUMENTS

WO    2009074918 A1    6/2009

OTHER PUBLICATIONS

Clare, S. "Functional Magnetic Resonance Imaging: Methods and Applications" Oct. 1997; [retreived from the internet], URL: http://http://users.fmrib.ox.ac.uk/~stuart/thesis_orig/fmri.pdf obtained on Jun. 27, 2016.*

(Continued)

*Primary Examiner* — Gregory H Curran
(74) *Attorney, Agent, or Firm* — Pearl Cohen Zedek Letzer Baratz LLP

(57) ABSTRACT

A method of operating a magnetic resonance imaging (MRI) device for habituating a patient and/or user to acoustic-noise of the device's operation. The method includes: listing a required set of the pulse-sequences (RSPS) for the patient, modifying the RSPS to a new set of sequences (NSPS) further comprising at least one demo-sequence, and operating, by means of generating the pulse-sequences, according to the NSPS. The demo-sequence is a redundant sequence, used solely for acoustic-sound habituation, while the originally listed RSPS are used for medical readings, thereby habituating the patient and/or user to the acoustic-noise of the operation.

17 Claims, 6 Drawing Sheets

(56) References Cited

U.S. PATENT DOCUMENTS

| | | |
|---|---|---|
| 2013/0328560 A1 | 12/2013 | Rapoport |
| 2013/0328563 A1 | 12/2013 | Rapoport |
| 2014/0050827 A1 | 2/2014 | Rapoport |
| 2014/0051973 A1 | 2/2014 | Rapoport et al. |
| 2014/0051974 A1 | 2/2014 | Rapoport et al. |
| 2014/0051976 A1 | 2/2014 | Rapoport et al. |
| 2014/0099010 A1 | 4/2014 | Rapoport et al. |
| 2014/0103927 A1 | 4/2014 | Rapoport |
| 2014/0117989 A1 | 5/2014 | Rapoport |
| 2014/0128725 A1 | 5/2014 | Rapoport et al. |
| 2014/0139216 A1 | 5/2014 | Rapoport |
| 2014/0142914 A1 | 5/2014 | Rapoport |
| 2014/0152302 A1 | 6/2014 | Rapoport et al. |
| 2014/0152310 A1 | 6/2014 | Rapoport |
| 2014/0158062 A1 | 6/2014 | Rapoport et al. |
| 2014/0230850 A1 | 8/2014 | Rapoport |
| 2014/0257081 A1 | 9/2014 | Rapoport |
| 2014/0266203 A1 | 9/2014 | Rapoport et al. |
| 2014/0300358 A1 | 10/2014 | Rapoport |
| 2014/0378821 A1 | 12/2014 | Rapoport et al. |
| 2014/0378825 A1 | 12/2014 | Rapoport et al. |
| 2015/0059655 A1 | 3/2015 | Rapoport |
| 2015/0065788 A1 | 3/2015 | Rapoport |

OTHER PUBLICATIONS

Aspect Imaging Ltd, "MRI-Incubator's Closure Assembly", co-pending U.S. Appl. No. 14/539,442, filed Nov. 12, 2014.
Aspect Imaging Ltd., "Shutting Assembly for Closing an Entrance of an MRI Device", co-pending U.S. Appl. No. 14/540,163, filed Nov. 13, 2014.
Aspect Imaging Ltd., "Cage in an MRD with a Fastening/Attenuating System", co-pending U.S. Appl. No. 14/527,950, filed Oct. 30, 2014.
Rapoport, Uri, "RF Shielding Conduit in an MRI Closure Assembly", co-pending U.S. Appl. No. 14/574,785, filed Dec. 18, 2014.
Aspect Imaging Ltd., "System and Method for Generating Invasively Hyperpolarized Images", co-pending U.S. Appl. No. 14/556,682, filed Dec. 1, 2014.
Aspect Imaging Ltd., "System and Method for Generating Invasively Hyperpolarized Images", co-pending U.S. Appl. No. 14/556,654, filed Dec. 1, 2014.
Aspect Imaging Ltd., "MRI with Magnet Assembly Adapted for Convenient Scanning of Laboratory Animals with Automated RF Tuning Unit", co-pending U.S. Appl. No. 14/581,266, filed Dec. 23, 2014.
Aspect Imaging Ltd., "Foamed Patient Transport Incubator", co-pending U.S. Appl. No. 14/531,289, filed Nov. 3, 2014.
Aspect Imaging Ltd., "Mechanical Clutch for MRI", co-pending U.S. Appl. No. 14/611,379, filed Feb. 2, 2015.
Aspect Imaging Ltd., "Incubator Deployable Multi-Functional Panel", co-pending U.S. Appl. No. 14/619,557, filed Feb. 11, 2015.
Aspect Imaging Ltd., "MRI Thermo-Isolating Jacket", co-pending U.S. Appl. No. 14/623,039, filed Feb. 16, 2015.
Aspect Imaging Ltd., "MRI RF Shielding Jacket", co-pending U.S. Appl. No. 14/623,051, filed Feb. 16, 2015.
Aspect Imaging Ltd., "Capsule for a Pneumatic Sample Feedway", co-pending U.S. Appl. No. 14/626,391, filed Feb. 19, 2015.
Aspect Imaging Ltd., "Incubator's Canopy with Sensor Dependent Variably Transparent Walls and Methods for Dimming Lights Thereof", co-pending U.S. Appl. No. 14/453,909, filed Aug. 7, 2014.
Aspect Imaging Ltd., "Temperature-Controlled Exchangeable NMR Probe Cassette and Methods Thereof", co-pending U.S. Appl. No. 14/504,890, filed Oct. 2, 2014.
Aspect Imaging Ltd., "NMR Extractable Probe Cassette Means and Methods Thereof", co-pending U.S. Appl. No. 14/504,907, filed Oct. 2, 2014.
Aspect Imaging Ltd., "Means for Operating an MRI Device Within a RF-Magnetic Environment", co-pending U.S. Appl. No. 14/596,320, filed Jan. 14, 2015.
Aspect Imaging Ltd., "Means and Method for Operating an MRI Device Within a RF-Magnetic Environment", co-pending U.S. Appl. No. 14/596,329, filed Jan. 14, 2015.
Aspect Imaging Ltd., "CT/MRI Integrated System for the Diagnosis of Acute Strokes and Methods Thereof", co-pending U.S. Appl. No. 14/598,517, filed Jan. 16, 2015.
Aspect Imaging Ltd., "RF Automated Tuning System Used in a Magnetic Resonance Device and Methods Thereof", co-pending U.S. Appl. No. 14/588,741, filed Jan. 2, 2015.
Aspect Imaging Ltd., "A Method for Providing High Resolution, High Contrast Fused MRI Images", co-pending U.S. Appl. No. 13/877,553, filed Apr. 3, 2013.
Aspect Imaging Ltd., "A Method for Manipulating the MRI's Protocol of Pulse-Sequences", co-pending U.S. Appl. No. 14/070,695, filed Nov. 4, 2013.
Chavan, Govind B., MRI Made Easy (for Beginners). 2013, 208 pages, Jaypee Brothers Medical Publishers P) Ltd, Phildelphia, PA., USA.
Chavhan, Govind B.,"MRI Made Easy (For Beginners)", 2007, 259 pages, Jaypee Brother Medical Publishers. U.S.

\* cited by examiner

METHOD FOR MANIPULATING THE MRI'S PROTOCOL OF PULSE-SEQUENCES

FIELD OF THE INVENTION

This invention generally relates to a method for scanning a patient with a magnetic resonance imaging (MRI) device and more particularly to a method that can ease the patient's exposure to the MRI's acoustic-noise.

BACKGROUND OF THE INVENTION

Magnetic resonance imaging (MRI) is a known modality for acquiring images of the inside of the body of a living patient. The basic components of an MRI device are a basic field magnet, a gradient system and a control system that produces pulses and controls the currents in the gradient coils that produce the pulse sequences. The time-variable coil currents achieve amplitude values of up to several 100 A and are subject to frequent and rapid changes in the direction of the current with rise and decay rates of several 100 kA/s. Given the presence of a basic magnetic field, these currents in the gradient coils cause vibrations due to Lorentz forces, which cause an acoustic-noise, by vibrating components of the apparatus.

Exposure to such an acoustic-noise can be extremely stressful for a patient and especially to newborn or premature babies. Exposure to a sudden, unexpected noise can cause startle reaction with stress responses and can cause non intentional injuries. A build up of stress can in turn reduce the level of oxygen reaching the baby's brain. Stress and decreased oxygen levels have associated health risks including increased rate of calorie burn and, in extreme cases, death.

Developments in the field of MRI are meant for shortening the measuring time and improving the image quality which involve a boost of the currents in the gradient coils, causing the acoustic-noise level to increase.

Previous investigations attempted to reduce the acoustic-noise by modifying the transmission path, i.e., modifying the mechanical structure of the MRI apparatus. These modifications were roughly implemented on the basis of empirical values. Prior art attempts to reduce the acoustic-noise level include, e.g., Plattel, WO 200907918, which discloses a method of performing an MRI scan with acoustic noise reduction in a magnetic resonance imaging system, the noise resulting from an operation of gradient coils of the magnetic resonance imaging system. Plattel's method comprising: measuring an acoustic noise, the acoustic noise resulting from an operation of the gradient coils; determining an acoustic response function, the acoustic frequency response function relating the measured noise to an excitation characteristic used for the operation of the gradient coils; calculating a set of Sound Pressure Levels (dB) using the acoustic response function, each sound pressure level of the set of sound pressure levels resulting as output of the response function from a different excitation characteristics as input to the response function; determining a sound pressure level minimum in the set of calculated sound pressure levels; and performing the magnetic resonance imaging scan using the excitation characteristics associated with the determined sound pressure level minimum.

Dietz, U.S. Pat. No. 6,407,548, discloses a method for operating a magnetic resonance tomography apparatus that contains a basic field magnet, a gradient system with gradient coils and a control system that controls the currents in the gradient coils, among other things, on the basis of pulse sequences, noise that is caused by a pulse sequence upon implementation thereof is identified before a start of the pulse sequence. When an identified noise lies above a selectable value, the pulse sequence is modified, so that the modified pulse sequence does not exceed the selectable value when it is implemented.

The above mentioned inventions disclose methods for reducing the acoustic noise by modifying the scanning pulse-sequences thereby interfering with the optimal scan requirements. There is thus a long felt need for an operating method for the MRI scan that can ease the patient's exposure to such acoustic-noise level, while optimizing the scan quality.

SUMMARY OF THE INVENTION

It is one object of the present invention to disclose a method for operating a magnetic resonance imaging (MRI) device for habituating a patient and/or user to acoustic-noise of said device's operation. The device is having inter alia the following: a main-magnet which generates a basic magnetic-field; radio-frequency (RF) coils, used for transmitting and receiving RF-signals from a patient; a gradient system containing: slice-selection, phase-encoding and frequency-encoding gradient-coils, for localizing said RF-signals; and a control-unit for supplying respective currents to said gradient-coils and said RF-coils to produce pulse-sequences. The method comprising steps of: listing a required set of said pulse-sequences (RSPS) for said patient; Modifying said RSPS to a new set of sequences (NSPS) further comprising at least one demo-sequence; and operating, by means of generating said pulse-sequences, according to said NSPS, The demo-sequence is a redundant sequence, used for acoustic-sound simulation solely, while the originally listed said RSPS, are used for medical readings, thereby habituating said patient and/or user to said acoustic-noise of said operation.

It is another object of the present invention to disclose the method as defined above, wherein said pulse-sequence is characterized by longitudinal magnetism of said main-magnet, transition parameters of said RF-signals, activation of said phase-encoding and frequency-encoding gradient-coils; said activation is correlated with the required: time to signal (TS) time to invert (TI), time to repeat (TR) and time to echo (TE).

It is another object of the present invention to disclose the method as defined above, further comprising a step of selecting said demo-sequence from said RSPS, thereby the demo-sequence is a duplicate.

It is another object of the present invention to disclose the method as defined above, further comprising a step of decreasing or increasing the magnetic intensity of at least one of the gradient-coils for the demo-sequence.

It is another object of the present invention to disclose the method as defined above, further comprising a step of decreasing or increasing number of repetitions of the demo-sequence.

It is another object of the present invention to disclose the method as defined above, further comprising a step of listing the at least one demo-sequence in a place selected from a group consisting of: first, last, between the RSPS and any combination thereof.

It is another object of the present invention to disclose a method for operating a magnetic resonance imaging (MRI) device for habituating a patient and/or user to acoustic-noise of the device's operation; the device having a main-magnet which generates a basic magnetic-field; radio-frequency (RF) coils, used for transmitting and receiving RF-signals from a patient; a gradient system containing: slice-selection, phase-encoding and frequency-encoding gradient-coils, for localizing the RF-signals; and a control-unit for supplying respective currents to the gradient-coils and the RF-coils to produce pulse-sequences; the method comprising steps of listing a required set of the pulse-sequences (RSPS) for the patient; determining acoustic-noise of each of said RSPS; reordering said RSPS to an ordered required set of said pulse-sequences (ORSPS); operating, by means of generating said pulse-sequences, according to said ORSPS; wherein said step of reordering of said RSPS is according to a predetermined scale of acoustic-noise of said pulse-sequences; thereby habituating said patient and/or user to said acoustic-noise.

It is another object of the present invention to disclose the method as defined above, wherein the pulse-sequence is characterized by longitudinal magnetism of the main-magnet, transition parameters of the RF-signals, and activation of the phase-encoding and frequency-encoding gradient-coils; the activation is correlated with the required: time to signal (TS) time to invert (TI), time to repeat (TR) and time to echo (TE).

It is another object of the present invention to disclose the method as defined above, wherein the scale of acoustic-noise comprises a time-function with a positive time-derivative.

It is another object of the present invention to disclose the method as defined above, wherein the scale of acoustic-noise comprises a time-function with a positive time-derivative until the acoustic-noise reaches to its maximum level and then the time-derivative is turning negative, until the operating is complete.

It is another object of the present invention to disclose the method as defined above, wherein the second time-derivative of the time-function is moderately changing or approximately constant.

It is another object of the present invention to disclose the method as defined above, further comprising a step of measuring the acoustic-noise level for each of the RSPS.

It is another object of the present invention to disclose the method as defined above, further comprising a step of evaluating the acoustic-noise level for each of the RSPS.

It is another object of the present invention to disclose the method as defined above, wherein the step of evaluating is in the frequency domain and further comprising steps of: identifying a transfer function, for each of the gradient coils, using the respective current therein as an input quantity, and the acoustic-noise level as an output quantity; multiplying the transfer function for each of the gradient coils by the Fourier transform of the current therein, for obtaining a plurality of multiplication products; integrating the multiplication products over the frequency domain for obtaining a plurality of integration results; and summing the integration results as a determination of the acoustic-noise level.

It is another object of the present invention to disclose the method as defined above, further comprising a step of selecting the RSPS according to a predetermined optimization algorithm.

It is another object of the present invention to disclose the method as defined above, further comprising a step of selecting at least one input-feature for the predetermined optimization algorithm, from a group consisting of repetition-time, echo-time, relaxation-time, and any combination thereof.

It is another object of the present invention to disclose a method for operating a magnetic resonance imaging (MRI) device for habituating a patient and/or user to acoustic-noise of the device's operation; the device having, inter alia, the following: a main-magnet which generates a basic magnetic-field; radio-frequency (RF) coils, used for transmitting and receiving RF-signals from a patient; a gradient system containing: slice-selection, phase-encoding and frequency-encoding gradient-coils, for localizing the RF-signals; and a control-unit for supplying respective currents to the gradient-coils and the RF-coils to produce pulse-sequences. The method comprising steps of: listing a required set of the sequence (RSPS) for the patient; modifying at least one of the RSPS thereby creating a modified set of pulse-sequences (MSPS); and operating, by means of generating the pulse-sequences, according to the MSPS. The modifying is by means of adding a redundant-activation of at least one of the coil-gradients to at least one of the RSPS, thereby habituating a patient and/or user to the acoustic-noise of the device's operation.

It is another object of the present invention to disclose the method as defined above, wherein the pulse-sequence is characterized by longitudinal magnetism of the main-magnet, transition parameters of the RF-signals, activation of the phase-encoding and frequency-encoding gradient-coils; the activation is correlated with the required: time to signal (TS) time to invert (TI), time to repeat (TR) and time to echo (TE).

It is still an object of the present invention to disclose the method as defined above, wherein the redundant-activation is a plus 180 degree and minus 180 degree or minus 180 degree and plus 180 degree of the phase-encoding gradient after the activation of the slice-selection gradient and before the activation of the frequency gradient.

Lastly, it is an object of the present invention to disclose a method for operating a magnetic resonance imaging (MRI) device for habituating a patient and/or user to acoustic-noise of the device's operation. The device having, inter alia, the following: a main-magnet which generates a basic magnetic-field; radio-frequency (RF) coils, used for transmitting and receiving RF-signals from a patient; a gradient system containing: slice-selection, phase-encoding and frequency-encoding gradient-coils, for localizing the RF-signals; and a control-unit for supplying respective currents to the gradient-coils and the RF-coils to produce pulse-sequences. The method comprising steps of: listing a required set of the pulse-sequences (RSPS) for the patient; modifying the RSPS to a new set of sequences (NSPS) further comprising at least one demo-sequence; and operating, by means of generating the pulse-sequences, according to the NSPS. Wherein the demo-sequence is a redundant sequence, used for acoustic-sound habituation solely, while the originally listed RSPS are used for medical readings, thereby habituating the patient and/or user to the acoustic-noise of the operation.

BRIEF DESCRIPTION OF THE DRAWINGS

The invention is herein described, by way of example only, with reference to the accompanying drawings, wherein.

DETAILED DESCRIPTION OF THE SPECIFIC EMBODIMENTS

Figure 1:
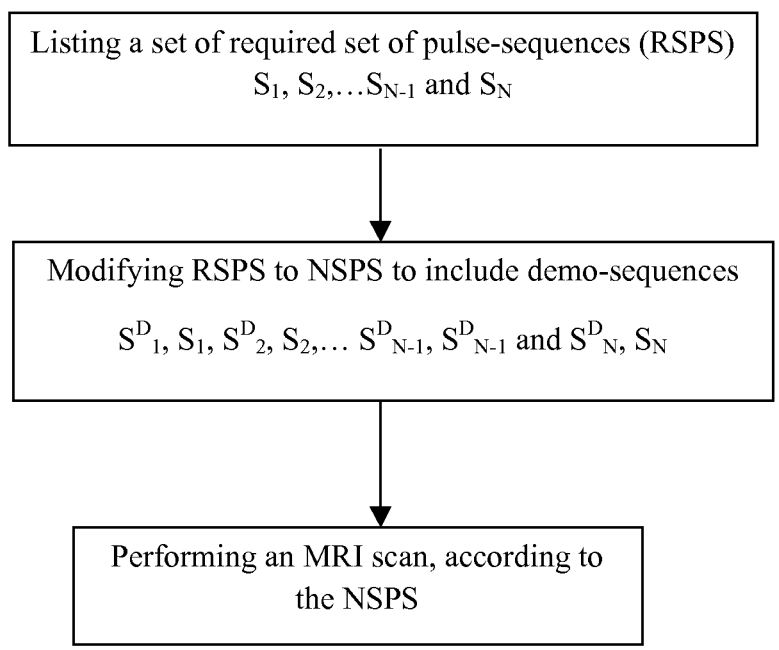
FIG. 1 is a schematic diagram showing a flowchart illustrating a method of operating a magnetic resonance imaging (MRI) scan including a demo-sequence for habituating to the acoustic-noise.

The following description is provided, alongside all chapters of the present invention, so as to enable any person skilled in the art to make use of the invention and sets forth the best modes contemplated by the inventor of carrying out this invention. Various modifications, however, are adapted to remain apparent to those skilled in the art, since the generic principles of the present invention have been defined specifically to provide a method operating a Magnetic resonance imaging (MRI) device that can ease the patient's exposure to the acoustic-noise level, while optimizing the scan quality.

The background theory, disclosed herein, is taken and summarized form an MRI teaching book: "MRI Made Easy (For Beginners)", (2006) by Chavhan Govind B, pub. JAYPEE. Govind has stated that at least four basic four components make an MRI system: (1) A magnet to produce external magnetic-field. Types of magnets include: permanent magnet, electro-magnet, super conducting magnet. (2) Gradient coils to localize the signal. Z-slice-selection gradient turned on when RF is sent. X-phase-encoding gradient, turned on between excitation pulse (90 deg) and signal measurement. The phase-encoding gradient has different strength for each TR within the same sequence. Y-frequency-encoding gradient, also called reading gradient, turned on during signal measurement. (3) Radio-Frequency (RF) coils, used to transmit and receive RF-signals from the patient. Types of RF-coils include: body coil, head coil, surface coil or local coil, solenoid coil and Helmholtz coil. (4) Computer system.

The term "pulse-sequence" refers here within to a subtle combination of radio-frequency (RF) pulses and gradients.

The terms "time to repeat" (TR), is the time interval between start of one RF pulse and start of next RF pulse.

The terms "time to echo" (TE), is the time interval between start of one RF pulse and reception of the echo (signal).

The terms "time of inversion (TI)", is the time between inverting 180 degree pulse 90 degree pulse, "in inversion recovery (IR)" sequence. TI determines the contrast of Inversion Recovery (IR) sequence.

The term "relaxation time" refers here within to a set of standard scans that depict differences in the spin-lattice (or $T_1$) or in the spin-spin (or $T_2$) relaxation time of various tissues within the body.

The term "predetermined optimization algorithm" refers here within to a scanning optimization algorithm adapted to produce a high quality imaging while considering different input-features including the above mentioned: repetition-time, echo-time and relaxation-time.

$T_1$ is the time taken for the Longitudinal Magnetization (LM) to recover to 63% of its original value, after RF pulse is switched off. $T_1$ depends up on tissue composition. $T_1$ weighted image is achieved by short TR.

$T_2$ is the time taken for the Transversal Magnetization (TM) to reduce to 37% of its original value, after RF pulse is switched off. $T_2$ weighted image is achieved by short TE.

Pulse sequenced can be broadly divided into following categories: (1) spin-echo (SE): conventional SE, and fast/turbo SE; (2) inversion recovery (IR); (3) gradient echo (GRE) (uses short flip angles); and (4) ultra fast sequence like EPI.

Weighted scans use a gradient echo (GRE) sequence, with long $T_E$ and long $T_R$. The gradient echo sequence used does not have the extra refocusing pulse used in spin echo so it is subject to additional losses above the normal $T_2$ decay (referred to as $T_2'$), these taken together are called $T^*_2$.

The present invention is a method for operating a magnetic resonance imaging (MRI) device for habituating a patient and/or user to acoustic-noise of the device's operation.

According to an embodiment of the invention, the MRI device has the following, inter alia: a main-magnet which generates a basic magnetic-field; radio-frequency (RF) coils, used for transmitting and receiving RF-signals from a patient; a gradient system containing: slice-selection, phase-encoding and frequency-encoding gradient-coils, for localizing the RF-signals; and a control-unit for supplying respective currents to the gradient-coils and the RF-coils to produce pulse-sequences.

According to an embodiment of the invention method comprising steps of listing a required set of the pulse-sequences (RSPS) for the patient, for example: $S_1, S_2, \ldots S_{N-1}$ and $S_N$; modifying the RSPS to a new set of sequences (NSPS) further comprising at least one demo-sequence; for example but not limited to: $S^D_1, S_1, S^D_2, S_2, \ldots S^D_{N-1}, S^D_{N-1}$ and $S^D_N, S_N$; and operating, by means of generating the pulse-sequences, according to the NSPS; wherein the demo-sequence $S^D$ is a redundant sequence, used for acoustic-sound simulation solely, while the originally listed the RSPS, are used for medical readings, thereby habituating the patient and/or user to the acoustic-noise of the operation.

The pulse-sequence is characterized by longitudinal magnetism of the main-magnet, transition parameters of the RF-signals, and activation of the phase-encoding and frequency-encoding gradient-coils, where the activation is correlated with the required: time to signal (TS) time to invert (TI), time to repeat (TR) and time to echo (TE).

According to another embodiment, the method further comprises a step of selecting the demo-sequence $S^D$ from the RSPS ($S_1, S_2, \ldots S_{N-1}$ and $S_N$), thereby the demo-sequence is a duplicate.

According to another embodiment, the method further comprises a step of decreasing or increasing the magnetic intensity of at least one of the gradient-coils, for the demo-sequence.

According to another embodiment, the method further comprises a step of decreasing or increasing number of repetitions of the demo-sequence.

According to another embodiment, the method further comprises a step of listing the at least one demo-sequence in a place selected from a group consisting of: first, last, between the RSPS and any combination thereof.

The present invention also provides a method for operating a magnetic resonance imaging (MRI) device for habituating a patient and/or user to acoustic-noise of the device's operation, comprising steps of: listing a required set of the pulse-sequences (RSPS) for the patient, for example: $S_1, S_2, \ldots S_{N-1}$ and $S_N$; determining acoustic-noise of each of the RSPS; reordering the RSPS to an ordered required set of the pulse-sequences (ORSPS); operating, by means of generating the pulse-sequences, according to the ORSPS; wherein the step of reordering of the RSPS is according to a predetermined scale of acoustic-noise of the pulse-sequences; thereby habituating the patient and/or user to the acoustic-noise.

Figure 3:
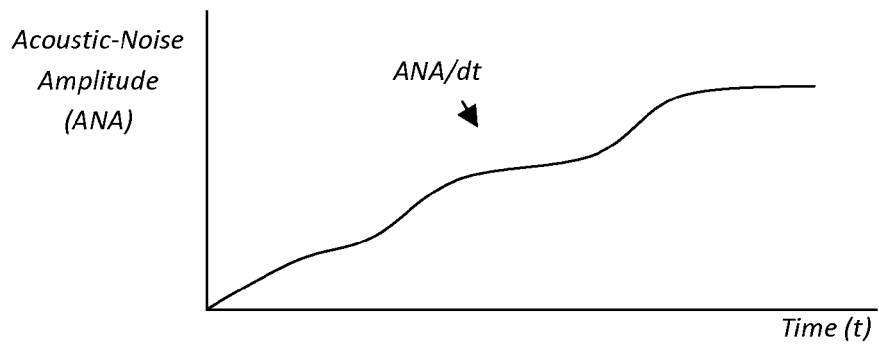
FIG. 3 is a schematic diagram demonstrating the acoustic-noise level in time, after the reordering of the pulse-sequences.

According to another embodiment, the scale of acoustic-noise comprises a time-function with a positive time-derivative, as demonstrated in FIG. 3.

Figure 4:
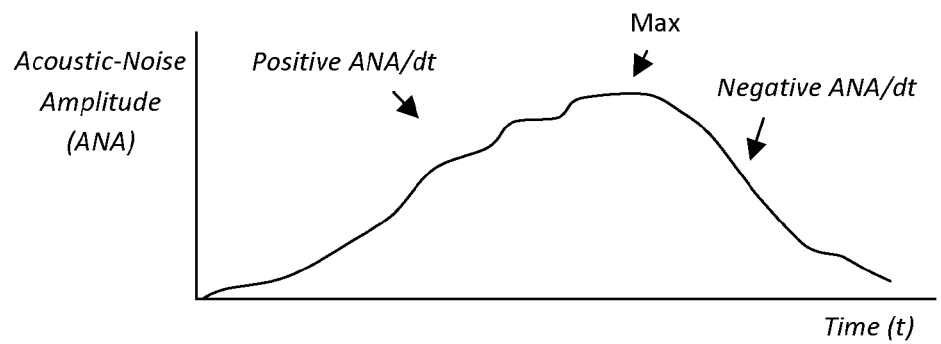
FIG. 4 is another schematic diagram demonstrating the acoustic-noise level in time, after the reordering of the pulse-sequences.

According to another embodiment, the scale of acoustic-noise comprises a time-function with a positive time-derivative until the acoustic-noise reaches to its maximum level and then the time-derivative is turning negative, until the operating is complete, as demonstrated in FIG. 4.

According to another embodiment, the second time-derivative of the time-function is moderately changing or approximately constant.

According to another embodiment, the method further comprises a step of measuring the acoustic-noise level for each of the RSPS.

According to another embodiment, the method further comprises a step of evaluating the acoustic-noise level for each of the RSPS.

According to another embodiment, the step of evaluating is in the frequency domain and further comprising steps of identifying a transfer function, for each of the gradient coils, using the respective current therein as an input quantity, and the acoustic-noise level as an output quantity; multiplying the transfer function for each of the gradient coils by the Fourier transform of the current therein, for obtaining a plurality of multiplication products; integrating the multiplication products over the frequency domain for obtaining a plurality of integration results; and summing the integration results as a determination of the acoustic-noise level.

According to another embodiment, the method further comprises a step of selecting the RSPS according to a predetermined optimization algorithm.

According to another embodiment, the method further comprises a step of selecting at least one input-feature for the predetermined optimization algorithm, from a group consisting of: repetition-time, echo-time, relaxation-time, and any combination thereof.

The present invention also provides a method for operating a magnetic resonance imaging (MRI) device for habituating a patient and/or user to acoustic-noise of the device's operation, comprising steps of: listing a required set of the sequence (RSPS) for the patient; for example: $S_1, S_2, \ldots S_{N-1}$ and $S_N$; modifying at least one of the RSPS thereby creating a modified set of pulse-sequences (MSPS); and operating, by means of generating the pulse-sequences, according to the MSPS; wherein the modifying is by means of adding a redundant-activation of at least one of the coil-gradients to at least one of the RSPS, thereby habituating a patient and/or user to the acoustic-noise of the device's operation.

Figure 6:
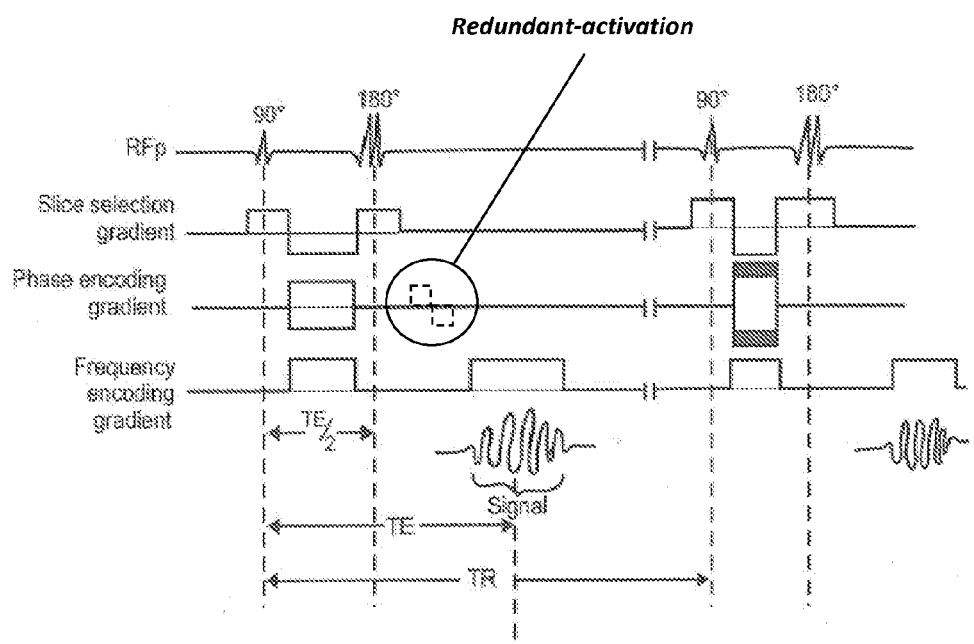
FIG. 6 is a schematic diagram showing an example of a redundant activation the phase-encoding coil-gradient.

According to another embodiment the redundant-activation is a +180 degree and −180 degree or −180 degree and +180 degree of the phase-encoding gradient after the activation of the slice-selection gradient and before the activation of the frequency gradient, as demonstrated in FIG. 6.

The present invention also provides a method for operating a magnetic resonance imaging (MRI) device for habituating a patient and/or user to acoustic-noise of the device's operation. The device is having inter alia the following: a main-magnet which generates a basic magnetic-field; radio-frequency (RF) coils, used for transmitting and receiving RF-signals from a patient; a gradient system containing: slice-selection, phase-encoding and frequency-encoding gradient-coils, for localizing the RF-signals; and a control-unit for supplying respective currents to the gradient-coils and the RF-coils to produce pulse-sequences. The method comprising steps of listing a required set of the pulse-sequences (RSPS) for the patient; modifying the RSPS to a new set of sequences (NSPS) further comprising at least one demo-sequence; and operating, by means of generating the pulse-sequences, according to the NSPS; wherein the demo-sequence is a redundant sequence, used for acoustic-sound habituation solely, while the originally listed the RSPS, are used for medical readings, thereby habituating the patient and/or user to the acoustic-noise of said operation.

Before explaining the figures, it should be understood that the invention is not limited in its application to the details of construction and the arrangement of the components set forth in the following description or illustrated in the drawings. The invention can be carried out in various ways.

Figure 2:
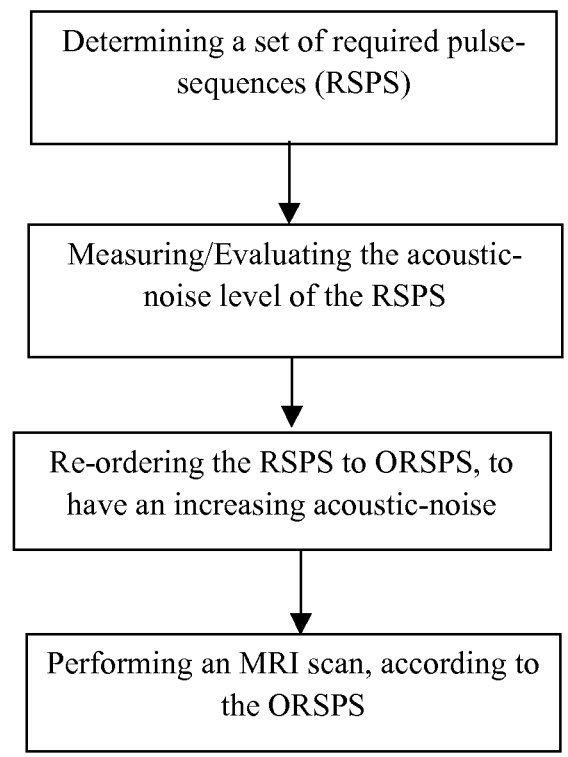
FIG. 2 is a schematic diagram showing a flowchart illustrating another method of operating a magnetic resonance imaging (MRI) scan which includes a reordering of the pulse-sequences for acoustic-noise manipulation.
Figure 5:
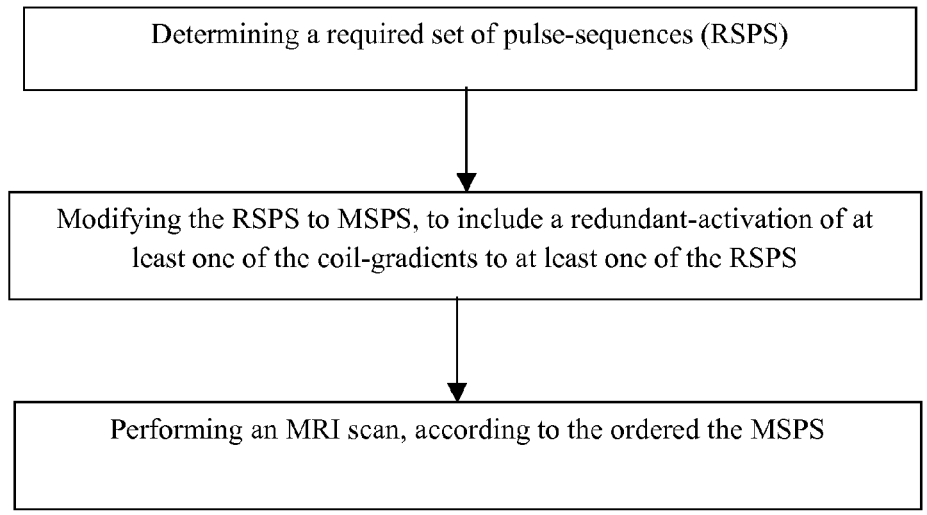
FIG. 5 is a schematic diagram showing a flowchart illustrating another method of operating a magnetic resonance imaging (MRI) scan, which include adding a redundant activation of at least one of the coil-gradients to at least one of the pulse-sequences.
Figure 7:
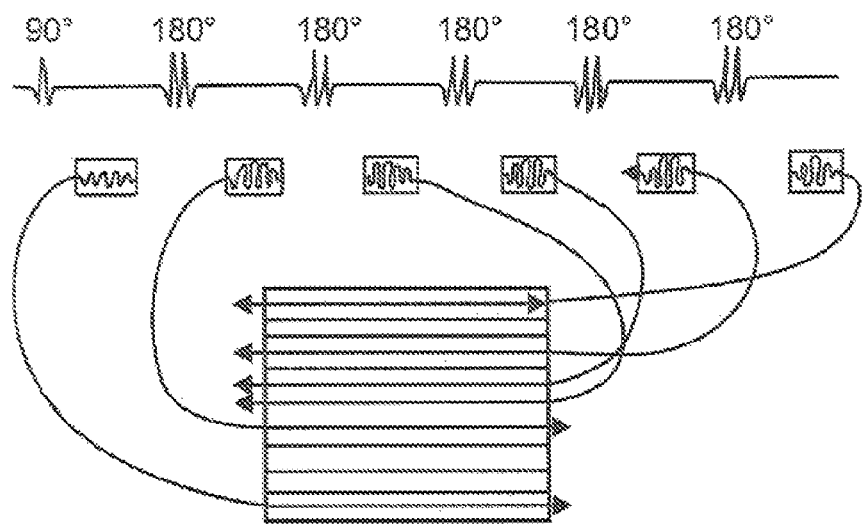
FIGS. 7-9 are prior art diagram showing demonstrating the basic of pulse-sequences.
Figure 8:
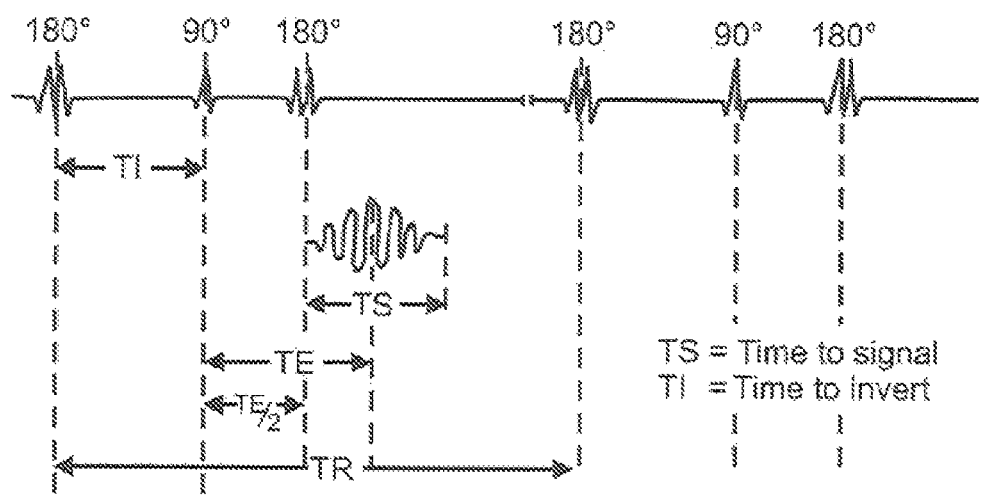
Figure 9:
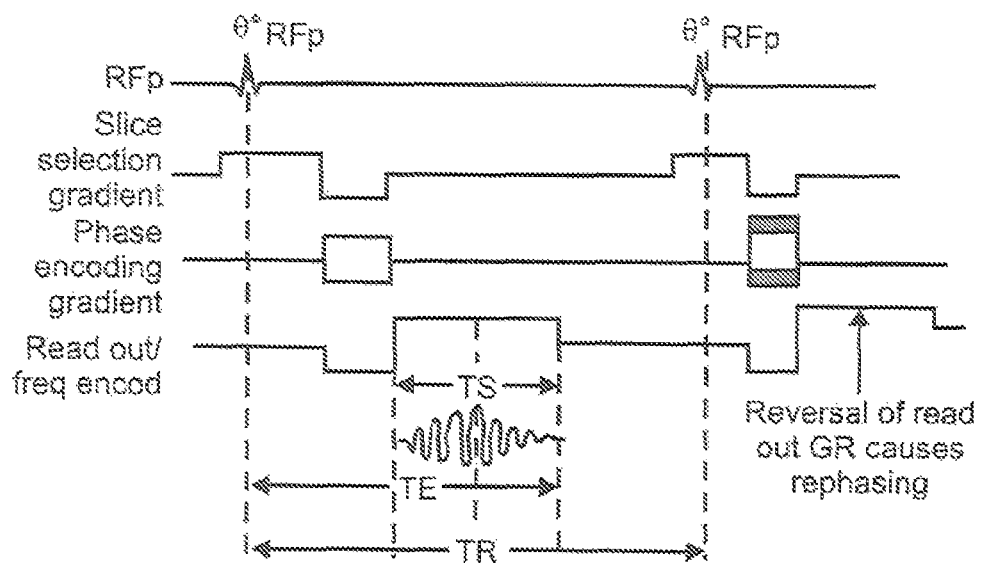

Reference is now made to FIG. 1, which is a schematic diagram showing a flowchart illustrating a method of operating a magnetic resonance imaging (MRI) scan including a demo-sequence for habituating to the acoustic-noise;

Reference is now made to FIG. 2, which is a schematic diagram showing a flowchart illustrating another embodiment of the present invention disclosing a method of operating a magnetic resonance imaging (MRI) scan which includes reordering the required pulse-sequences for acoustic-noise manipulation;

Reference is now made to FIG. 3, which is a schematic graph diagram demonstrating the acoustic-noise level in time, after the reordering of the pulse-sequences;

Reference is now made to FIG. 4, which is another schematic graph diagram demonstrating the acoustic-noise level in time, after the reordering of the pulse-sequences;

Reference is now made to FIG. 5, which is a schematic diagram showing a flowchart illustrating another method of operating a magnetic resonance imaging (MRI) scan which includes adding a redundant activation of at least one of the coil gradients to at least one of the pulse-sequences;

Reference is now made to FIG. 6, which is a schematic diagram showing an example of a redundant activation the phase-encoding coil-gradient. The redundant-activation is a plus 180 degree and minus 180 degree of the phase-encoding gradient after the activation of the slice-selection gradient and before the activation of the frequency gradient Reference is now made to FIGS. 7-9, which are prior art diagrams demonstrating the basic of pulse-sequences. FIG. 7 discloses prior art turbo echo-spin sequence with multiple echoes contributed to a single k-space per TR. FIG. 8 discloses an inversion recovery sequences (two sequences). FIG. 9 discloses a gradient echo sequences (two sequences).

The invention claimed is:
1. A method for operating a magnetic resonance imaging (MRI) device for habituating a patient and/or user to acoustic-noise of said device's operation;
    said device having:
    a main-magnet which generates a basic magnetic-field;
    radio-frequency (RF) coils, used for transmitting and receiving RF-signals from a patient;

a gradient system containing: slice-selection, phase-encoding and frequency-encoding gradient-coils, for localizing said RF-signals; and a control-unit for supplying respective currents to said gradient-coils and said RF-coils to produce pulse-sequences;

said method comprising steps of:
a. listing a required set of said pulse-sequences (RSPS) for said patient;
b. determining acoustic-noise of each of said RSPS;
c. reordering said RSPS to an ordered required set of said pulse-sequences (ORSPS); and
d. operating, by means of generating said pulse-sequences, according to said ORSPS;
wherein said step of reordering of said RSPS is according to a predetermined scale of acoustic-noise of said pulse-sequences; thereby habituating said patient and/or user to said acoustic-noise, and
wherein said scale of acoustic-noise comprises a time-function with a positive time-derivative.

2. The method according to claim 1, wherein said pulse-sequences characterized by:
longitudinal magnetism of said main-magnet,
transition parameters of said RF-signals,
activation of said phase-encoding and frequency-encoding gradient-coils; said activation is correlated with the required: time to signal (TS) time to invert (TI), time to repeat (TR) and time to echo (TE).

3. The method according to claim 1, further comprising step of measuring said acoustic-noise level for each of said RSPS.

4. The method according to claim 1, further comprising step of evaluating said acoustic-noise level for each of said RSPS.

5. The method according to claim 4, wherein said step of evaluating is in the frequency domain and further comprising steps of:
a. identifying a transfer function, for each of said gradient coils, using the respective current therein as an input quantity, and said acoustic-noise level as an output quantity;
b. multiplying said transfer function for each of said gradient coils by the Fourier transform of the current therein, for obtaining a plurality of multiplication products;
c. integrating said multiplication products over the frequency domain for obtaining a plurality of integration results; and
d. summing said integration results as a determination of said acoustic-noise level.

6. The method according to claim 1, further comprising step of selecting said RSPS according to a predetermined optimization algorithm.

7. The method according to claim 6, further comprising step of selecting at least one input-feature for said predetermined optimization algorithm, from a group consisting of repetition-time, echo-time, relaxation-time, and any combination thereof.

8. A method for operating a magnetic resonance imaging (MRI) device for habituating a patient and/or user to acoustic-noise of said device's operation;
said device having:
a main-magnet which generates a basic magnetic-field;
radio-frequency (RF) coils, used for transmitting and receiving RF-signals from a patient;

a gradient system containing: slice-selection, phase-encoding and frequency-encoding gradient-coils, for localizing said RF-signals; and a control-unit for supplying respective currents to said gradient-coils and said RF-coils to produce pulse-sequences;

said method comprising steps of:
e. listing a required set of said pulse-sequences (RSPS) for said patient;
f. determining acoustic-noise of each of said RSPS;
g. reordering said RSPS to an ordered required set of said pulse-sequences (ORSPS);
h. operating, by means of generating said pulse-sequences, according to said ORSPS;
wherein said step of reordering of said RSPS is according to a predetermined scale of acoustic-noise of said pulse-sequences; thereby habituating said patient and/or user to said acoustic-noise, and
wherein said scale of acoustic-noise comprises a time-function with a positive time-derivative until said acoustic-noise reaches to its maximum level and then said time-derivative is turning negative, until said operating is complete.

9. The method according to claim 1 or 8, wherein a second time-derivative of said time-function is moderately changing or approximately constant.

10. The method according to claim 8, wherein said pulse-sequences characterized by:
longitudinal magnetism of said main-magnet,
transition parameters of said RF-signals,
activation of said phase-encoding and frequency-encoding gradient-coils; said activation is correlated with the required: time to signal (TS) time to invert (TI), time to repeat (TR) and time to echo (TE).

11. The method according to claim 8, further comprising step of measuring said acoustic-noise level for each of said RSPS.

12. The method according to claim 8, further comprising step of evaluating said acoustic-noise level for each of said RSPS.

13. The method according to claim 12, wherein said step of evaluating is in the frequency domain and further comprising steps of:
a. identifying a transfer function, for each of said gradient coils, using the respective current therein as an input quantity, and said acoustic-noise level as an output quantity;
b. multiplying said transfer function for each of said gradient coils by the Fourier transform of the current therein, for obtaining a plurality of multiplication products;
c. integrating said multiplication products over the frequency domain for obtaining a plurality of integration results; and
d. summing said integration results as a determination of said acoustic-noise level.

14. The method according to claim 8, further comprising step of selecting said RSPS according to a predetermined optimization algorithm.

15. The method according to claim 14, further comprising step of selecting at least one input-feature for said predetermined optimization algorithm, from a group consisting of repetition-time, echo-time, relaxation-time, and any combination thereof.

16. A method for operating a magnetic resonance imaging (MRI) device for habituating a patient and/or user to acoustic-noise of said device's operation;

said device having:

a main-magnet which generates a basic magnetic-field;

radio-frequency (RF) coils, used for transmitting and receiving RF-signals from a patient;

a gradient system containing: slice-selection, phase-encoding and frequency-encoding gradient-coils, for localizing said RF-signals; and a control-unit for supplying respective currents to said gradient-coils and said RF-coils to produce pulse-sequences;

said method comprising steps of:

a. listing a required set of said sequence (RSPS) for said patient;

b. modifying at least one of said RSPS thereby creating a modified set of pulse-sequences (MSPS); and c. operating, by means of generating said pulse-sequences, according to said MSPS;

wherein said modifying by means of adding a redundant-activation of at least one of said coil-gradients to at least one of said RSPS, thereby habituating a patient and/or user to said acoustic-noise of said device's operation, and wherein said redundant-activation is a plus 180 degree and minus 180 degree or minus 180 degree and plus 180 degree of said phase-encoding gradient after the activation of said slice-selection gradient and before the activation of said frequency gradient.

17. The method according to claim 16, wherein said pulse-sequences characterized by longitudinal magnetism of said main-magnet, transition parameters of said RF-signals; activation of said phase-encoding and frequency-encoding gradient-coils; said activation is correlated with the required: time to signal (TS) time to invert (TI), time to repeat (TR) and time to echo (TE).

* * * * *